US012272926B2

(12) United States Patent
Li et al.

(10) Patent No.: US 12,272,926 B2
(45) Date of Patent: Apr. 8, 2025

(54) DC-COUPLED LASER DIODE DRIVER CIRCUIT WITH LARGE MODULATION CURRENT

(71) Applicant: XIAMEN EOCHIP SEMICONDUCTOR CO., LTD, Xiamen (CN)

(72) Inventors: Jinghu Li, Xiamen (CN); Zhicong Luo, Xiamen (CN); Hanghui Tu, Xiamen (CN)

(*) Notice: Subject to any disclaimer, the term of this patent is extended or adjusted under 35 U.S.C. 154(b) by 688 days.

(21) Appl. No.: 17/621,421

(22) PCT Filed: Jun. 18, 2021

(86) PCT No.: PCT/CN2021/100963
§ 371 (c)(1),
(2) Date: Dec. 21, 2021

(87) PCT Pub. No.: WO2022/028128
PCT Pub. Date: Feb. 10, 2022

(65) Prior Publication Data
US 2022/0360042 A1 Nov. 10, 2022

(30) Foreign Application Priority Data
Aug. 3, 2020 (CN) .......................... 202010767443.9

(51) Int. Cl.
*H01S 5/042* (2006.01)
*H01S 5/068* (2006.01)
(52) U.S. Cl.
CPC ........ *H01S 5/0427* (2013.01); *H01S 5/06808* (2013.01)

(58) Field of Classification Search
CPC .......................... H01S 5/0427; H01S 5/06808
See application file for complete search history.

(56) References Cited

U.S. PATENT DOCUMENTS

2020/0091678 A1* 3/2020 Zou .................. G05F 3/265

FOREIGN PATENT DOCUMENTS

CN 109066290 A 12/2018

* cited by examiner

*Primary Examiner* — Michael Carter
(74) *Attorney, Agent, or Firm* — Novoclaims Patent Services LLC; Mei Lin Wong

(57) ABSTRACT

A DC-coupled laser driver circuit with large modulation current belongs to the optical field. The present invention solves the problem that the conventional laser driver circuit consumes too much voltage margin because the transistor is used as the tail current source, resulting in a small modulation current. The present invention includes a negative feedback unit, an adaptive drive unit, a mirrored tail current source, a resistor R11, a resistor R12, a bias current source IBIAS and a diode D2; The resistor R12, laser D1, resistor R11, and bias current source IBIAS are connected in series between the voltage VCC and the ground in sequence; the input terminal of the negative feedback unit is connected to the data signal input ports TINP and TINN, the output terminal of the negative feedback unit is connected to the input terminal of the adaptive drive unit, the output terminal of the adaptive drive unit is connected to the control signal input terminal of the mirrored tail current source, a drive signal output terminal of the mirrored tail current source is connected to the anode of the laser D1 through a diode D2, the other drive signal output terminal of the mirrored tail current source is connected to the cathode of the laser D1.

6 Claims, 3 Drawing Sheets

DC-COUPLED LASER DIODE DRIVER CIRCUIT WITH LARGE MODULATION CURRENT

BACKGROUND OF THE PRESENT INVENTION

Field of Invention

The present invention relates to a driver circuit of a DFB laser, which belongs to the field of laser drivers in optical communication integrated circuits.

Description of Related Arts

At the transmitting end of the optical fiber communication integrated circuit, a laser driver (Laser Diode Driver) turns on or off the laser device according to the logical value of the data stream, and uses the optical fiber to transmit the optical signal to the optical line terminal OLT over a long distance, and then the current signal is converted into a voltage signal through the transimpedance amplifier (TIA). The laser must be biased near the threshold in order to reduce the randomness of the laser turn-on delay and reduce jitter, so the laser driver must provide a bias current (IBIAS) and modulation current (IMOD). The bias current of the laser needs to be continuously adjusted for temperature changes and aging, and the modulation current is also needed to change the luminous efficiency (ER) of the laser.

FIG. 1 shows the structure of a commonly used laser diode driver circuit. In FIG. 1, D0 is a laser device, which is biased near the threshold light-emitting point by a current source Ib. The current source Im provides a modulation current to the laser diode driver. The data streams TINP and TINN are replaced by a modulation current to drive the laser device D0 to turn on and off to transmit data. The threshold current and luminous efficiency of semiconductor laser device will vary with temperature and duration of use. The threshold current of a semiconductor laser device will increase significantly with the increase of temperature, and the luminous efficiency will decrease with the increase of temperature. The drift of the threshold current and luminous efficiency of the semiconductor laser device causes great inconvenience to its application. In order to overcome these problems, the output power must be controlled so that the work of the lasor device can be maintained at the correct operating point.

The photodiode D1 converts the light emitted by the laser D0 into a monitoring current Ic, then the current is converted into a voltage through the on-chip resistor R2. The off-chip capacitor C1 filters out the AC component in the current signal Ic and retains the DC component, which is the average optical power (AP) of laser D0. The average optical power voltage is compared with the reference voltage Vref, and the error amplifier A1 outputs the error voltage to adjust the bias current Ib of the laser D0, so that the average optical power meets the design requirements.

The ambient temperature detector TS detects the working temperature of the laser driver to characterize the working temperature of the laser, and set the compensation range of the modulation current in advance according to the needs of use. The current of the modulation current source Im is adjusted by the digital-to-analog conversion module DAC and the voltage-current conversion module V2I, so that the laser meets a certain luminous efficiency (ER) requirement.

In practical applications, the traditional laser driver circuit shown in FIG. 1 is connected to the laser by DC coupling, which has the advantages of multi-rate compatibility, low power consumption, and fewer off-chip components. According to the modulation current output formula:

$$I_c(Max) = \frac{V_{CC} - V_D - V_{CE(Q2)} - V_{D(Im)}}{R_{LOAD}} \quad (1)$$

$V_{CC}$ is the power supply voltage, $V_D$ is the voltage drop of the laser device, $V_{CE(Q2)}$ is the voltage drop of the collector terminal and emitter terminal of transistor Q2, $V_{D(Im)}$ is the voltage drop of the current source, and $R_{LOAD}$ is the internal resistance of the laser. Formula 1 shows that when the internal resistance $R_{LOAD}$ of the laser device is constant, reducing the voltage drop $V_{D(Im)}$ of the current source can increase the maximum value of the modulation current Imod of the laser driver circuit.

The differential pair needs to use a transistor as a tail current source to control the magnitude of the modulation current. The transistor tail current source in this method consumes a lot of voltage margin, causing the maximum modulation current to be too small.

SUMMARY OF THE PRESENT INVENTION

An object of the present invention is to provides DC-coupled laser diode driver circuit with a large modulation current so as to solve the problem that the conventional laser driver circuit consumes too much voltage margin due to the use of transistor as a tail current source and has a small resulting modulation current.

According to the present invention, a DC-coupled laser diode driver circuit with large modulation current comprises a negative feedback unit, an adaptive drive unit, a mirrored tail current source, a resistor R11, a resistor R12, a bias current source IBIAS and a diode D2;

the resistor R12, the laser D1, the resistor R11, and the bias current source IBIAS are connected in series between the voltage VCC and the ground in sequence;
an input terminal of the negative feedback unit is connected to data signal input ports TINP and TINN, an output terminal of the negative feedback unit is connected to an input terminal of the adaptive drive unit, an output terminal of the adaptive drive unit is connected to a control signal input terminal of the mirrored tail current source, a drive signal output terminal of the mirrored tail current source is connected to the anode of the laser D1 through a diode D2, and the other drive signal output terminal of the mirrored tail current source is connected to the cathode of the laser D1.

Preferably, it further comprises an inductor L1, wherein the mirrored tail current source is grounded through the inductor L1.

Preferably, the negative feedback unit comprises NPN transistors Q1~Q2, a NPN transistor Q12, a resistor R1, a resistor R2, a resistor R8, a resistor R10, a variable resistor R13, an error amplifier A1, a current source I3, and a current source I4;

the adaptive drive unit comprises NPN transistors Q3~Q7, a NPN transistor Q13, resistors R3~R5, a current source I1 and a current source I2;
the mirrored tail current source comprises NPN transistors Q8~Q10, a resistor R6 and a resistor R7;
a base terminal of the NPN transistor Q1 is connected to the data signal input port TINP;

a base terminal of the NPN transistor Q2 is connected to the data signal input port TINN;

an emitter terminal of the NPN transistor Q1 and an emitter terminal of the NPN transistor Q2 are simultaneously connected to a positive terminal of the current source I4;

a negative terminal of the current source I4 is connected to ground;

a collector terminal of the NPN transistor Q1 is simultaneously connected to one end of the resistor R1 and a base terminal of the NPN transistor Q7;

a collector terminal of the NPN transistor Q2 is simultaneously connected to one end of the resistor R2 and a base terminal of the NPN transistor Q6;

the other end of the resistor R1 is simultaneously connected to the other end of the resistor R2, a base terminal of the NPN transistor Q13 and an output terminal of the error amplifier A1;

a collector terminal VOUT of the NPN transistor Q13 is simultaneously connected to a collector terminal of the NPN transistor Q6, a collector of the NPN transistor Q7, a positive terminal of the controllable current source IBIAS and one end of the resistor R11;

an emitter terminal of the NPN transistor Q13 is simultaneously connected to a collector terminal and a base terminal of the NPN transistor Q3, a base terminal of the NPN transistor Q4 and a base terminal of the NPN transistor Q5;

an emitter of the NPN transistor Q3 is grounded through the resistor R3;

an emitter of the NPN transistor Q4 is grounded through the resistor R4;

an emitter of the NPN transistor Q5 is grounded through the resistor R5;

a collector terminal of the NPN transistor Q4 is simultaneously connected to an emitter terminal of the NPN transistor Q6, a positive terminal of the current source I1, a base terminal of the NPN transistor Q9 and a base terminal of the NPN transistor Q11;

a collector terminal of the NPN transistor Q5 is simultaneously connected to an emitter terminal of the NPN transistor Q7, a positive terminal of the current source I2, a base terminal of the NPN transistor Q8 and a base terminal of the NPN transistor Q10;

the other ends of the current sources I1 and I2 are grounded simultaneously;

one end of the resistor R6 is simultaneously connected to an emitter terminal of the NPN transistor Q8 and an emitter terminal of the NPN transistor Q9;

one end of the resistor R8 is simultaneously connected to a collector terminal of the NPN transistor Q8 and a collector terminal of the NPN transistor Q9, and the other end of the resistor R8 is connected to an emitter terminal of the NPN transistor Q12;

the other end of the resistor R6 and the other end of the resistor R7 are simultaneously connected to one end of the inductor L1, and the other end of the inductor L1 is grounded;

a collector of the NPN transistor Q10 is connected through a matching network 1 to a cathode and an output port TOUTN of the laser D1, and the other end of the resistor R11;

a collector terminal of the NPN transistor Q11 is connected to a cathode of the diode D2;

an anode of the diode D2 is connected through the matching network 2 to an anode and an output port TOUTP of the laser D1, and one end of the resistor R12; the other end of the resistor R12 is connected to a power supply VCC;

a negative terminal of the controllable current source IBIAS is grounded;

a base terminal of the NPN transistor Q12 is connected to a voltage port VB;

a collector of the NPN transistor Q12 is simultaneously connected to a non-inverting input terminal of the error amplifier A1 and one end of the variable resistor R13;

the other end of the variable resistor R13 is connected to the power supply VCC;

an inverting input terminal of the error amplifier A1 is simultaneously connected to the positive terminal of the current source I3 and one end of the resistor R10;

the other end of the resistor R10 is connected to the power supply VCC;

a negative terminal of the current source I3 is grounded.

Preferably, the variable resistor R13 can be adjusted so that a voltage at the non-inverting input terminal and the inverting input terminal of the error amplifier A1 are equal.

Preferably, a resistance of the resistor R7 is less than 3Ω.

Preferably, a base voltage of the transistor Q8-Q11 is controlled between 0.7V~0.8V.

The beneficial effects of the present invention: a laser driver circuit with high modulation current is proposed, which abandons the traditional method of laser driver in which a transistor-type tail current source is used to provide modulation current, and utilizes a new circuit structure with mirrored tail current source to greatly reduces the voltage drop at the tail current source and maximizes the increase in modulation current to meet the performance requirements of the DFB laser. The simulation result verification has been passed.

DETAILED DESCRIPTION OF THE PREFERRED EMBODIMENT

Figure 1:
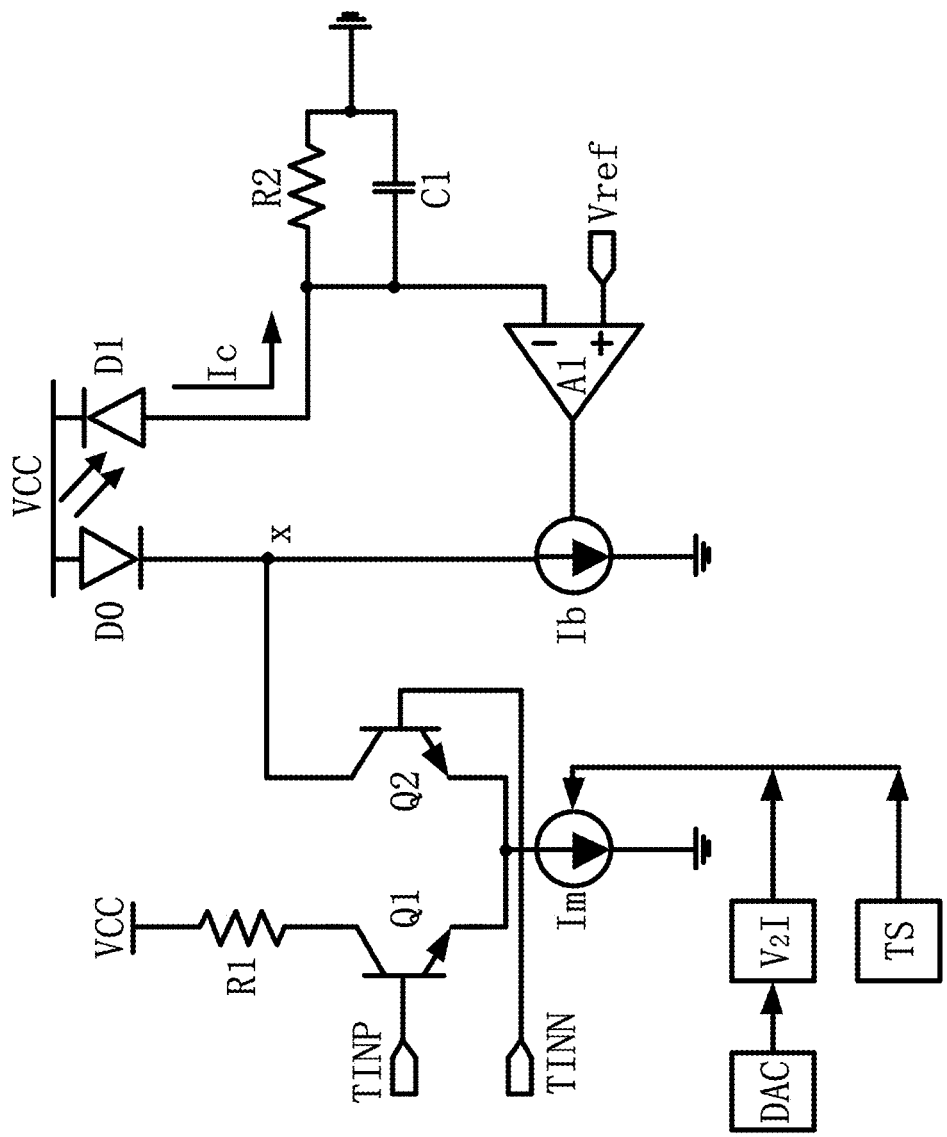
FIG. 1 is a schematic diagram of a conventional laser diode driver.
Figure 2:
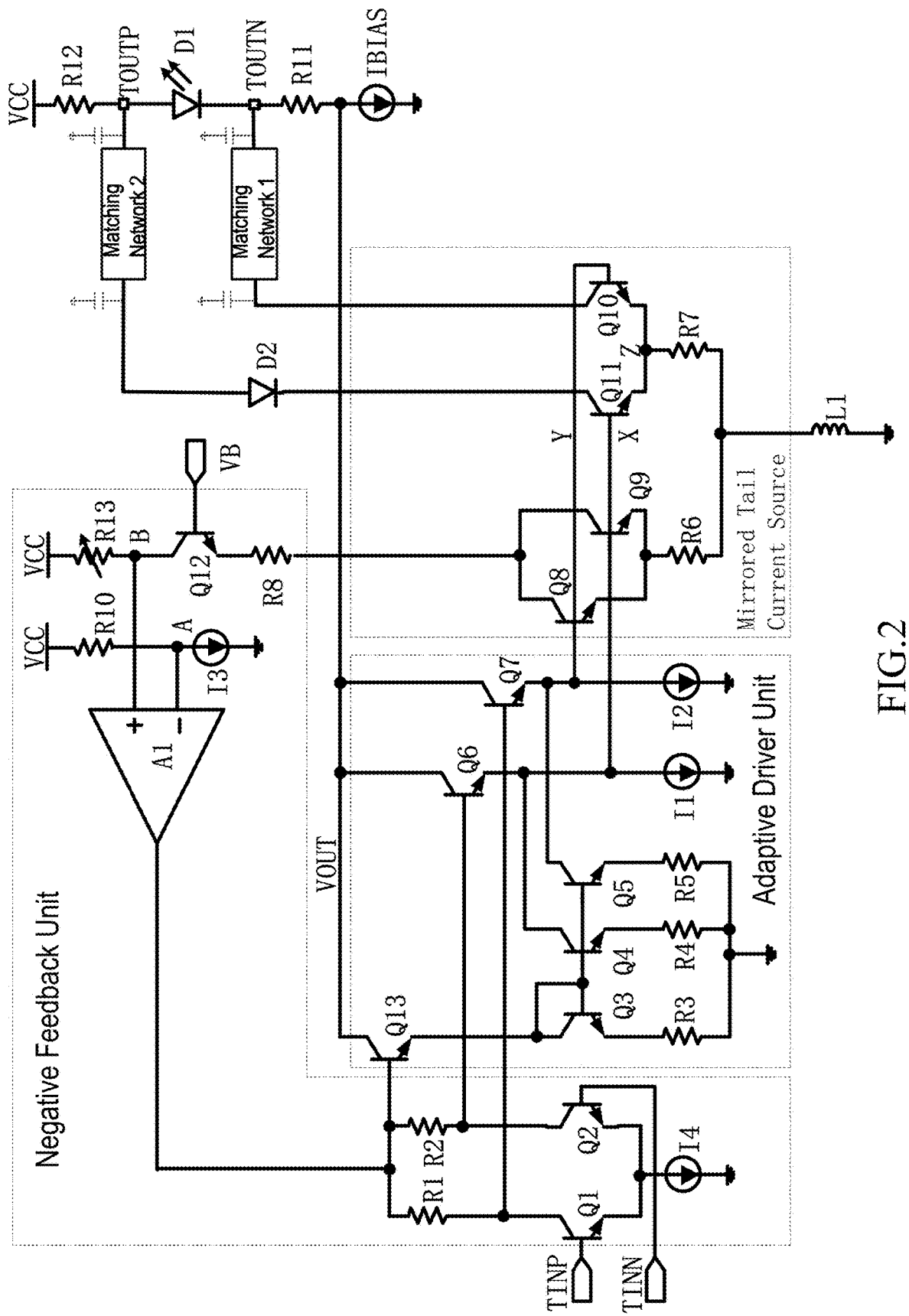
FIG. 2 is a schematic diagram of a DC-coupled laser diode driver with large modulation current of the present invention.

In the description of the commonly used laser diode driver circuit, the differential pair needs to use a transistor as the tail current source to realize the control of the modulation current. The transistor tail current source in this method consumes a lot of voltage margin, causing the maximum modulation current to be too small. According to FIG. 2, a laser diode driver circuit with large modulation current is provided, which solves the problem that the tail current source consumes a large amount of voltage margin, greatly increases the modulation current that the driver stage can output, and meets the performance requirements of DFB lasers.

Preferred Embodiment 1: This embodiment is described with reference to FIG. 2 and FIG. 3 as follows: According to this embodiment, a DC-coupled laser diode driver circuit with large modulation current comprises a negative feedback unit, an adaptive drive unit, a mirrored tail current source, a resistor R11, a resistor R12, a bias current source IBIAS and a diode D2;

the negative feedback unit comprises NPN transistors Q1~Q2, a NPN transistor Q12, a resistor R1, a resistor R2, a resistor R8, a resistor R10, a variable resistor R13, an error amplifier A1, a current source I3, and a current source I4;

the adaptive drive unit comprises NPN transistors Q3~Q7, a NPN transistor Q13, resistors R3~R5, a current source I1 and a current source I2;

the mirrored tail current source comprises NPN transistors Q8~Q10, a resistor R6 and a resistor R7;

a base terminal of the NPN transistor Q1 is connected to the data signal input port TINP;

a base terminal of the NPN transistor Q2 is connected to the data signal input port TINN;

an emitter terminal of the NPN transistor Q1 and an emitter terminal of the NPN transistor Q2 are simultaneously connected to a positive terminal of the current source I4, a negative terminal of the current source I4 is connected to the ground;

a collector terminal of the NPN transistor Q1 is simultaneously connected to one end of the resistor R1 and a base terminal of the NPN transistor Q7;

a collector terminal of the NPN transistor Q2 is simultaneously connected to one end of the resistor R2 and a base terminal of the NPN transistor Q6;

the other end of the resistor R1 is simultaneously connected to the other end of the resistor R2, a base terminal of the NPN transistor Q13 and an output terminal of the error amplifier A1;

a collector terminal VOUT of the NPN transistor Q13 is simultaneously connected to a collector terminal of the NPN transistor Q6, a collector of the NPN transistor Q7, a positive terminal of the controllable current source IBIAS and one end of the resistor R11;

an emitter terminal of the NPN transistor Q13 is simultaneously connected to a collector terminal and a base terminal of the NPN transistor Q3, a base terminal of the NPN transistor Q4 and a base terminal of the NPN transistor Q5;

an emitter of the NPN transistor Q3 is grounded through the resistor R3;

an emitter of the NPN transistor Q4 is grounded through the resistor R4;

an emitter of the NPN transistor Q5 is grounded through the resistor R5;

a collector terminal of the NPN transistor Q4 is simultaneously connected to an emitter terminal of the NPN transistor Q6, a positive terminal of the current source I1, a base terminal of the NPN transistor Q9 and a base terminal of the NPN transistor Q11;

a collector terminal of the NPN transistor Q5 is simultaneously connected to an emitter terminal of the NPN transistor Q7, a positive terminal of the current source I2, a base terminal of the NPN transistor Q8 and a base terminal of the NPN transistor Q10;

the other ends of the current sources I1 and I2 are grounded simultaneously;

one end of the resistor R6 is simultaneously connected to an emitter terminal of the NPN transistor Q8 and an emitter terminal of the NPN transistor Q9;

one end of the resistor R8 is simultaneously connected to a collector terminal of the NPN transistor Q8 and a collector terminal of the NPN transistor Q9, and the other end of the resistor R8 is connected to an emitter terminal of the NPN transistor Q12;

the other end of the resistor R6 and the other end of the resistor R7 are simultaneously connected to one end of the inductor L1, and the other end of the inductor L1 is grounded;

a collector of the NPN transistor Q10 is connected through a matching network 1 to a cathode and an output port TOUTN of the laser D1, and the other end of the resistor R11;

a collector terminal of the NPN transistor Q11 is connected to a cathode of the diode D2; an anode of the diode D2 is connected through the matching network 2 to an anode and an output port TOUTP of the laser D1, and one end of the resistor R12;

the other end of the resistor R12 is connected to a power supply VCC;

a negative terminal of the controllable current source IBIAS is grounded;

a base terminal of the NPN transistor Q12 is connected to a voltage port VB;

a collector of the NPN transistor Q12 is simultaneously connected to a non-inverting input terminal of the error amplifier A1 and one end of the variable resistor R13;

the other end of the variable resistor R13 is connected to the power supply VCC;

an inverting input terminal of the error amplifier A1 is simultaneously connected to the positive terminal of the current source I3 and one end of the resistor R10;

the other end of the resistor R10 is connected to the power supply VCC;

a negative terminal of the current source I3 is grounded.

The data streams TINP and TINN of the electrical signal are transmitted along the signal path, and finally the transistors Q10 and Q11 are controlled to turn on and off, so as to realize the switching of the direction of the modulation current. The negative feedback unit, transistors Q6, Q7, Q8, Q9, resistor R6, and current sources I1-I2 together form a negative feedback loop. The current value of the current source I3 is set to determine the voltage value of point A at the positive terminal of the current source I3. Under the action of the negative feedback loop, the voltages at points A and B are equal. When the resistance of the variable resistor R13 decreases, the current flowing through the transistor Q12 increases. When the resistance value of the variable resistor R13 increases, the current flowing through the transistor Q12 decreases. Transistor Q8-Q11, resistors R6 and R7 form a current mirror circuit, which is a new type of mirrored tail current source circuit structure, and the formula for calculating the modulation current Imod is:

$$I_{mod} = \frac{R_7}{R_6} \times \frac{I_3 R_{10}}{R_{13}} \qquad (2)$$

Compared with the conventional structure of a laser driver circuit, the transistors Q10 and Q11 both mirror the currents of the transistors Q8 and Q9 while acting as signal input tubes. The emitters of transistors Q10 and Q11 are connected to a small resistor R7 to replace the transistor-type tail current source. If R7=2Ω, the modulation current Imod=90 mA, the voltage drop of the resistor R7 is only 180 mV. According to formula (1), this method can increase the maximum modulation current Imod of the laser driver circuit.

Under the action of the negative feedback loop, the base voltage of the transistors Q8-Q11 is just a little bit higher than the turn-on threshold voltage of the transistor 0.7V. The purpose is to make the transistors Q8-Q11 turn off and on quickly in response to changes in data flow. Because the resistance of the resistor R7 is very small, when the base terminals of the transistors Q10 and Q11 receive a rapidly changing data stream, they will quickly transmit the AC signal to the ground through the resistor R7. Therefore, the inductance L1 must be increased to prevent the AC signal from being conducted to the ground, so that the modulation current is all applied to the laser D1, and the luminous efficiency of the laser is improved.

The effect of adding the diode D2 is to eliminate the offset, so that the working environment of the transistors Q10 and Q11 are consistent, and the signal error is reduced.

As the modulation current Imod increases, the transconductances of transistors Q10 and Q11 increase, so the Miller equivalent capacitance added to the base end of Q10 and Q11 will also increase. Transistors Q3, Q4, Q5, Q6, Q7 and Q13, resistors R3-R5 form an adaptive drive circuit. When the modulation current Imod increases, the output voltage of the error amplifier A1 increases, so the Q13 emitter current increases. Under the action of the current mirror, the emitter current of the transistors Q6 and Q7 increases, so the driving capability is increased, which effectively drives the larger Miller equivalent capacitance at the base terminals of Q10 and Q11, and improves the output eye diagram. The presence of parasitic capacitance at the output end of the laser will affect the increase of the transmission signal rate, reflection or reduction of the transmission signal. Therefore, the matching network 1 and 2 are added to eliminate the influence of parasitic capacitance.

Figure 3:
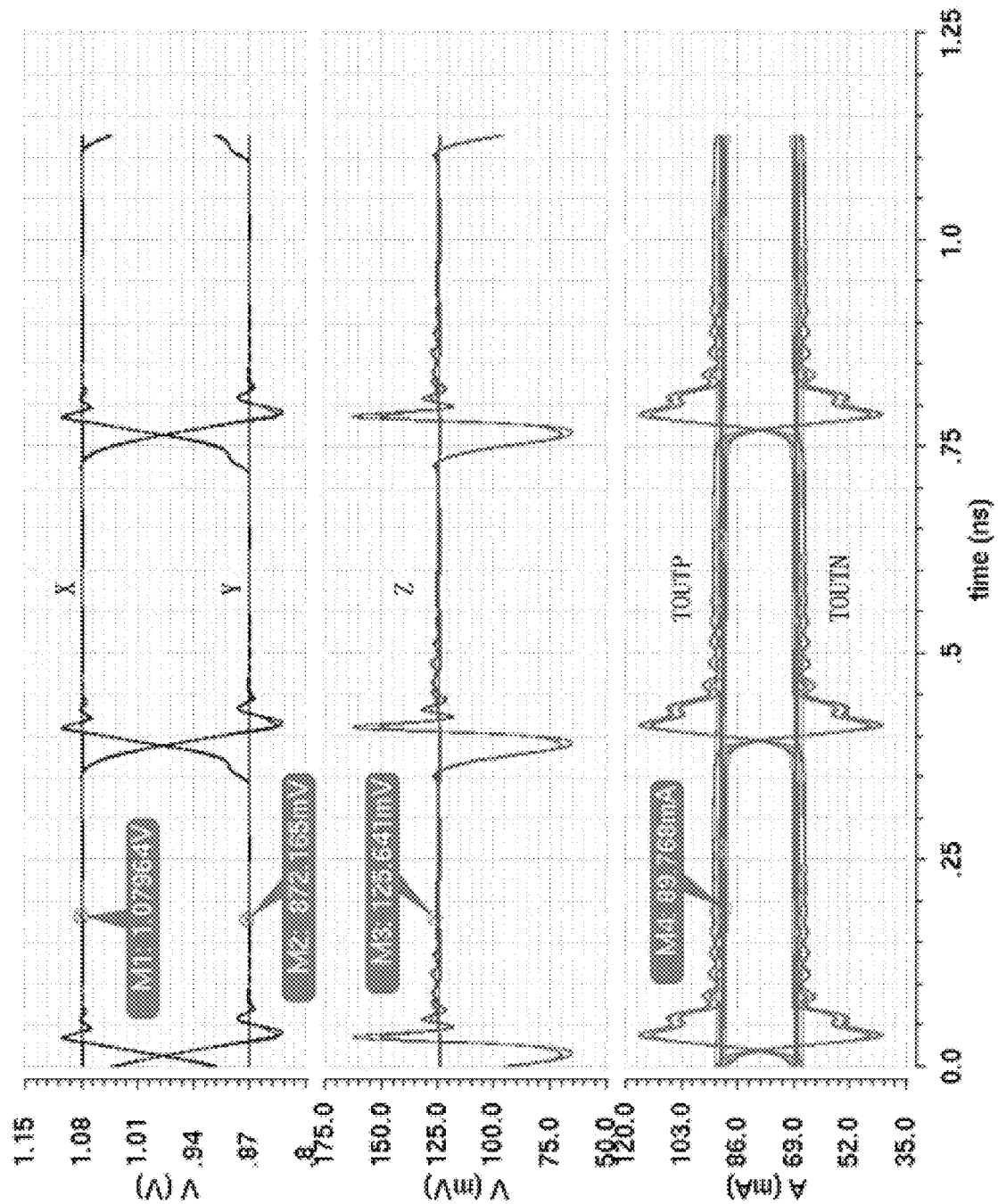
FIG. 3 is a simulation diagram showing the key nodes of the DC-coupled laser diode driver circuit with large modulation current of the present invention.

FIG. 3 is a simulation diagram of the present invention. The TOUTP portion of the curve can output a modulation current of 89.7 mA. Curve Z is the voltage drop of resistor R7, which is 125 mV. Curve XY is an eye diagram formed by the data stream reaching the bases of transistors Q10 and Q11, and its DC level is approximately 900 mV. It can be seen from the above data that the present invention solves the problems of the conventional laser driver.

The present invention provides a laser diode driver circuit with large modulation current in which a transistor-type tail current source with a huge consumption voltage margin is removed, and a small resistor is used instead to output a large modulation current. The low bias voltage value of the input tube can facilitate the rapid change of the signal. The feedback loop is embedded in the present invention, the bias current increases while the laser modulation current increases, and the driving capability is enhanced. The above improvements can well meet the performance requirements of laser long-distance transmission.

What is claimed is:

1. A DC-coupled laser drive circuit with large modulation current, comprising: a negative feedback unit, an adaptive drive unit, a mirrored tail current source, a resistor R11, a resistor R12, a bias current source IBIAS and a diode D2,
the resistor R12, thea laser D1, the resistor R11, and the bias current source IBIAS are connected in series between thea voltage VCC and a ground in sequence;
an input terminal of the negative feedback unit is connected to data signal input ports TINP and TINN, an output terminal of the negative feedback unit is connected to an input terminal of the adaptive drive unit, an output terminal of the adaptive drive unit is connected to a control signal input terminal of the mirrored tail current source, a drive signal output terminal of the mirrored tail current source is connected to an anode of the laser D1 through a diode D2, and another drive signal output terminal of the mirrored tail current source is connected to a cathode of the laser D1.

2. The DC-coupled laser drive circuit for large modulation current according to claim 1, further comprising an inductor L1, wherein the mirrored tail current source is grounded through the inductor L1.

3. The DC-coupled laser drive circuit for large modulation current according to claim 2,
wherein the negative feedback unit comprises two NPN transistors Q1-Q2, a NPN transistor Q12, a resistor R1, a resistor R2, a resistor R8, a resistor R10, a variable resistor R13, an error amplifier A1, a current source I3, and a current source I4;
the adaptive drive unit comprises five NPN transistors Q3-Q7, a NPN transistor Q13, three resistors R3-R5, a current source I1 and a current source I2;
the mirrored tail current source comprises three NPN transistors Q8-Q10, a resistor R6 and a resistor R7;
a base terminal of the NPN transistor Q1 is connected to the data signal input port TINP;
a base terminal of the NPN transistor Q2 is connected to the data signal input port TINN;
an emitter terminal of the NPN transistor Q1 and an emitter terminal of the NPN transistor Q2 are simultaneously connected to a positive terminal of the current source I4;
a negative terminal of the current source I4 is connected to ground;
a collector terminal of the NPN transistor Q1 is simultaneously connected to one end of the resistor R1 and a base terminal of the NPN transistor Q7;
a collector terminal of the NPN transistor Q2 is simultaneously connected to one end of the resistor R2 and a base terminal of the NPN transistor Q6;
another end of the resistor R1 is simultaneously connected to another end of the resistor R2, a base terminal of the NPN transistor Q13 and an output terminal of the error amplifier A1;
a collector terminal VOUT of the NPN transistor Q13 is simultaneously connected to a collector terminal of the NPN transistor Q6, a collector of the NPN transistor Q7, a positive terminal of the controllable current source IBIAS and one end of the resistor R11;
an emitter terminal of the NPN transistor Q13 is simultaneously connected to a collector terminal and a base terminal of the NPN transistor Q3, a base terminal of the NPN transistor Q4 and a base terminal of the NPN transistor Q5;
an emitter of the NPN transistor Q3 is grounded through the resistor R3;
an emitter of the NPN transistor Q4 is grounded through the resistor R4;
an emitter of the NPN transistor Q5 is grounded through the resistor R5;
a collector terminal of the NPN transistor Q4 is simultaneously connected to an emitter terminal of the NPN transistor Q6, a positive terminal of the current source I1, a base terminal of the NPN transistor Q9 and a base terminal of the NPN transistor Q11;
a collector terminal of the NPN transistor Q5 is simultaneously connected to an emitter terminal of the NPN transistor Q7, a positive terminal of the current source I2, a base terminal of the NPN transistor Q8 and a base terminal of the NPN transistor Q10;

another ends of the current sources I1 and I2 are grounded simultaneously;

one end of the resistor R6 is simultaneously connected to an emitter terminal of the NPN transistor Q8 and an emitter terminal of the NPN transistor Q9;

one end of the resistor R8 is simultaneously connected to a collector terminal of the NPN transistor Q8 and a collector terminal of the NPN transistor Q9, and another end of the resistor R8 is connected to an emitter terminal of the NPN transistor Q12;

another end of the resistor R6 and another end of the resistor R7 are simultaneously connected to one end of the inductor L1, and another end of the inductor L1 is grounded;

a collector of the NPN transistor Q10 is connected through a matching network 1 to a cathode and an output port TOUTN of the laser D1, and another end of the resistor R11;

a collector terminal of the NPN transistor Q11 is connected to a cathode of the diode D2; an anode of the diode D2 is connected through the matching network 2 to an anode and an output port TOUTP of the laser D1, and one end of the resistor R12;

another end of the resistor R12 is connected to a power supply VCC;

a negative terminal of the controllable current source IBIAS is grounded;

a base terminal of the NPN transistor Q12 is connected to a voltage port VB;

a collector of the NPN transistor Q12 is simultaneously connected to a non-inverting input terminal of the error amplifier A1 and one end of the variable resistor R13;

another end of the variable resistor R13 is connected to the power supply VCC;

an inverting input terminal of the error amplifier A1 is simultaneously connected to the positive terminal of the current source I3 and one end of the resistor R10;

another end of the resistor R10 is connected to the power supply VCC;

a negative terminal of the current source I3 is grounded.

4. The DC-coupled laser drive circuit for large modulation current according to claim 3, wherein the variable resistor R13 is adjusted so that a voltage at the non-inverting input terminal and the inverting input terminal of the error amplifier A1 are equal.

5. The DC-coupled laser drive circuit for large modulation current according to claim 3, wherein a resistance of the resistor R7 is less than 30Ω.

6. The DC-coupled laser drive circuit for large modulation current according to claim 1, wherein a base voltage of the transistors Q8-Q11 are controlled between 0.7V and 0.8V.

* * * * *